(12) United States Patent
Kurachi et al.

(10) Patent No.: US 7,245,131 B2
(45) Date of Patent: Jul. 17, 2007

(54) CAPACITANCE DETECTION APPARATUS

(75) Inventors: Kohei Kurachi, Nishio (JP); Hisashi Inaba, Kariya (JP)

(73) Assignee: Aisin Seiki Kabushiki Kaisha, Aichi-ken (JP)

( * ) Notice: Subject to any disclaimer, the term of this patent is extended or adjusted under 35 U.S.C. 154(b) by 30 days.

(21) Appl. No.: 11/337,489

(22) Filed: Jan. 24, 2006

(65) Prior Publication Data

US 2006/0170411 A1    Aug. 3, 2006

(30) Foreign Application Priority Data

Jan. 28, 2005    (JP)    .............................. 2005-021342

(51) Int. Cl.
  *G01R 27/26*    (2006.01)
  *H01G 5/16*    (2006.01)
(52) U.S. Cl. .................. 324/663; 324/661; 324/686; 361/290
(58) Field of Classification Search .............. 324/663, 324/649, 600, 658–690; 73/335.04, 514.32, 73/304 C, 780, 862.337, 862.626; 361/280, 361/290; 382/124
See application file for complete search history.

(56) References Cited

U.S. PATENT DOCUMENTS

| | | | |
|---|---|---|---|
| 5,541,580 A * | 7/1996 | Gerston et al. .......... 340/573.4 |
| 5,586,042 A * | 12/1996 | Pisau et al. .................... 702/65 |
| 5,730,165 A | 3/1998 | Philipp et al. | |
| 6,535,694 B2 * | 3/2003 | Engle et al. ................. 396/263 |
| 6,724,324 B1 * | 4/2004 | Lambert ....................... 341/33 |
| 7,138,809 B2 * | 11/2006 | Nakamura et al. .......... 324/681 |
| 2003/0132763 A1 * | 7/2003 | Ellenz ......................... 324/663 |
| 2005/0068712 A1 * | 3/2005 | Schulz et al. ............... 361/287 |
| 2006/0250142 A1 * | 11/2006 | Abe ........................... 324/663 |

FOREIGN PATENT DOCUMENTS

| | | |
|---|---|---|
| EP | 1 339 025 A | 8/2003 |
| EP | 1 505 734 A | 2/2005 |
| EP | 1 583 236 A | 10/2005 |
| EP | 1 521 090 A | 4/2006 |
| JP | 5-106376 | 4/1993 |
| JP | 2005-134178 | 5/2005 |
| WO | WO 00/31553 A | 6/2000 |
| WO | WO 03/021782 A | 3/2003 |

* cited by examiner

*Primary Examiner*—Andrew H. Hirshfeld
*Assistant Examiner*—Hoai-An D. Nguyen
(74) *Attorney, Agent, or Firm*—Sughrue Mion, PLLC

(57) ABSTRACT

A capacitance detection apparatus includes a detection electrode for detecting approach of an object on the basis of a change of capacitance, a calculating circuit for calculating a value associated with the capacitance change, a judging circuit for judging whether the calculated value is a normal or initial value calculated after or before a predetermined period of time lapse from a start time of the capacitance detection apparatus, an initial reference value-determining circuit for determining an initial reference value, a difference calculating circuit for calculating a difference between the normal value and a value calculated earlier than a time when the normal value is calculated by the predetermined period of time or longer or between the initial value and the initial reference value, and a determining circuit for determining whether the object is approaching by comparing the difference with a predetermined threshold value.

11 Claims, 2 Drawing Sheets

CAPACITANCE DETECTION APPARATUS

CROSS REFERENCE TO RELATED APPLICATIONS

This application is based on and claims priority under 35 U.S.C. § 119 to Japanese Patent Application 2005-021342, filed on Jan. 28, 2005, the entire content of which is incorporated herein by reference.

FIELD OF THE INVENTION

This invention generally relates to a capacitance detection apparatus. More particularly, this invention pertains to a capacitance detection apparatus for detecting approach of an object such as a human body.

BACKGROUND

A capacitance detection apparatus for detecting approach of an object such as a human body on the basis of a change of capacitance is conventionally known. In these years, such capacitance detection apparatus is utilized in a system for controlling open/close of a boarding door of a vehicle. In such system, the capacitance detection apparatus is utilized for detecting a trigger of an unlock operation. Specifically, when a user approaches a vehicle, correspondence between identification (ID) code of a vehicle side and that of a mobile apparatus of the user is checked, and the mode of the vehicle transfers into an unlock permission mode. Then, when the user touches an unlock sensor (electrode) provided in an outside door handle of the vehicle at this time, the vehicle side detects a change of capacitance of the unlock sensor electrode and performs an unlock operation. In other words, the capacitance detection apparatus detects an intention of the user to unlock the door utilizing an output from the unlock sensor (change of capacitance) (for example, as described in JP2005-134178A).

In such capacitance detection apparatus, in order to judge, on the basis of the detected change of capacitance, whether an object to be detected approaches in actual or not, it needs to be considered whether a difference between values associated with the change of capacitance, currently detected and detected in the past, is equal to or more, or equal to or less, than the threshold value. In other words, because an approaching object induces characteristic profiles in records of the capacitance change, judging an approach of an object without correctly detecting the characteristic profiles tends to lead to an operational error. Accordingly, in order for reliably judging whether a currently detected change of a value associated with the capacitance change is caused by an approach of an object to be detected, a value associated with the past capacitance change needs to be referred.

Generally, for detecting an approach of a human body, a value associated with the capacitance change recorded earlier, by approximately 250 millisecond, than the profile of the capacitance change caused by the approach of the human body needs to be referred. This causes a difficulty for detecting a human body by the capacitance detection apparatus before 250 millisecond lapses from a start time of the capacitance detection apparatus.

However, in general cases in which the capacitance detection apparatus is utilized for unlocking the vehicle as described above, the capacitance detection apparatus is not always in operation. The capacitance detection apparatus starts operation after correspondence between an ID code of a vehicle and that of a user is checked and the ID of the user is identified. Accordingly, before 250 millisecond lapses from when the user is identified, a human body cannot be detected. Therefore, the user cannot unlock the door until 250 millisecond lapses after the capacitance detection apparatus starts operation, even when the user wants to unlock the vehicle earlier. Accordingly, in a case where this kind of the capacitance detection apparatus is applied to unlock of the vehicle, improvement in response has been desired.

A need thus exists for a capacitance detection apparatus, which has improved response for detecting approach of an object at an initial stage after the capacitance detection apparatus starts operation. The present invention has been made in view of the above circumstances and provides such a capacitance detection apparatus.

SUMMARY OF THE INVENTION

According to an aspect of the present invention, a capacitance detection apparatus for detecting approach of an object on the basis of a change of capacitance includes a detection electrode for detecting the change of the capacitance by approaching the object, a calculating circuit for calculating a value associated with the change of the capacitance detected by the detection electrode, a judging circuit for judging whether the value calculated by the calculating circuit is a normal value which is calculated after a predetermined period of time lapse from a start time of the capacitance detection apparatus or an initial value which is calculated before the predetermined period of time lapse from the start time of the capacitance detection apparatus, an initial reference value-determining circuit for determining an initial reference value for the value judged by the judging circuit as the initial value, a difference calculating circuit for calculating a difference between the value judged by the judging circuit as the normal value and a value calculated at a time earlier than a time when the value judged by the judging circuit as the normal value is calculated by the predetermined period of time or longer, or a difference between the value judged by the judging circuit as the initial value and the initial reference value determined by the initial reference value-determining circuit, and a determining circuit for determining whether or not the object is approaching by comparing the difference calculated by the difference calculating circuit with a predetermined threshold value.

BRIEF DESCRIPTION OF THE DRAWINGS

The foregoing and additional features and characteristics of the present invention will become more apparent from the following detailed description considered with reference to the accompanying drawings, wherein.

DETAILED DESCRIPTION

An embodiment of the present invention will be explained with reference to drawing figures.

Figure 1:
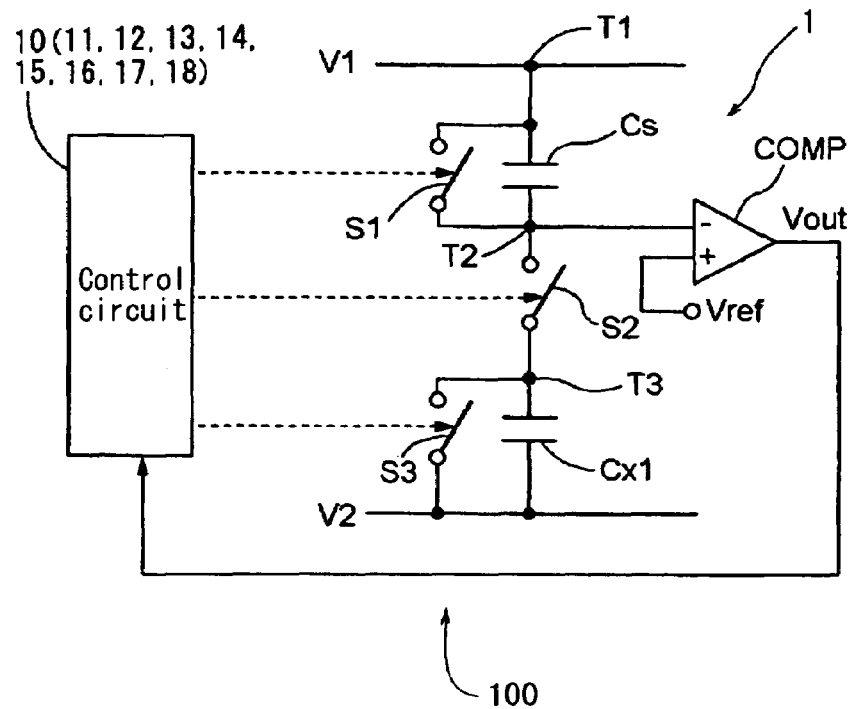
FIG. 1 represents a schematic diagram illustrating a circuit configuration of a capacitance detection apparatus according to an embodiment of the present invention.

FIG. 1 represents a schematic diagram illustrating a circuit configuration of a capacitance detection apparatus according to the embodiment. The capacitance detection apparatus can be installed in a vehicle or the like and utilized as a sensor for detecting a human body approaching the sensor.

As illustrated in the figure, a capacitance detection apparatus 100 includes a detecting portion 1 and a control circuit 10. The detecting portion 1 includes a first open/close switch S1 provided between both ends T1, T2 of a reference capacitor Cs of which one end is connected to a voltage source V1, a second open/close switch S2 provided between one end T3 of a capacitor to be measured (detection electrode) C×1, of which the other end is connected to a second voltage source V2 or connected to a free space, and the other end T2 of the reference capacitor Cs, and a third open/close switch S3 provided between the one end T3 of the capacitor to be measured C×1 and the voltage source V2. Further, as a voltage measuring means for measuring a voltage at the other end T2 of the reference capacitor Cs, a comparator COMP is provided at the other end T2. Here, the first voltage source V1 is an output from a constant voltage circuit. The second voltage source V2 is a grounded portion (ground). Further, a reference voltage Vref is connected to a positive terminal of the comparator COMP, and the other end T2 of the reference capacitor Cs is connected to a negative terminal of the comparator COMP.

The control circuit 10 is configured from a hardware logic circuit or a microcomputer, or the like. The control circuit 10 transmits drive signals to the open/close switches S1, S2 and S3, and feeds output signals Vout from the comparator COMP.

In the control circuit 10, a switching means 11 is provided for performing a switching control. In the switching control, as waveforms illustrated in FIG. 2, a first switching operation, in which the first open/close switch S1 is once closed (indicated by high level in the figure) and re-opened (indicated by low level in the figure), is performed, and after the first switching operation, a second switching operation, in which the second open/close switch S2 is once closed and re-opened, and a third switching operation, in which the third open/close switch S3 is once closed and re-opened, are alternatively repeated. Further, the control circuit 10 includes a counter 12 (calculating circuit) for counting a number of repetition of the second switching operation, a timer 13 for counting 250 millisecond from when the capacitance detection apparatus 100 starts operation, a judging circuit 14 for judging whether a value counted and retained by the counter 12 is an initial counted value or a normal counted value, a stability detection circuit 15, an initial reference value-determining circuit 16, a difference calculating circuit 17, and a determining circuit 18.

Figure 2:
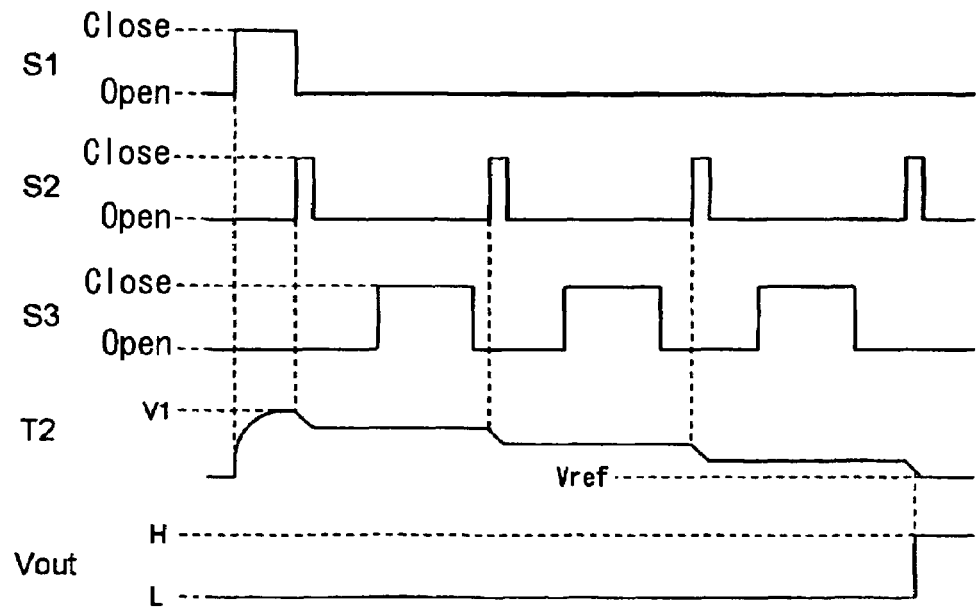
FIG. 2 represents a waveform chart illustrating operations of the circuit illustrated in FIG. 1.

In the detection electrode 1, because an initial voltage at the other end T2 of the reference capacitor Cs is a voltage of the first voltage source V1, and a reference voltage Vref is set lower than the initial voltage V1 by a set voltage (set voltage=V1−Vref), an output signal Vout from the comparator COMP becomes low level after the first switching operation. Then, when the second switching operation is performed, current flows to the capacitor to be measured C×1 from the reference capacitor Cs, and the capacitor to be measured C×1 is charged. Then, the voltage at the other end T2 of the reference capacitor Cs is thereby lowered. Then, when the third switching operation is performed, the capacitor to be measured C×1 is discharged. The repetition of the second switching operation and the third switching operation lowers the voltage at the other end T2 of the reference capacitor Cs. When the voltage at the other end T2 is lowered from the initial voltage V1 by more than the set voltage (V1−Vref), and the voltage at the other end T2 becomes lower than the reference voltage Vref, the output signal Vout from the comparator COMP changes from a low level to a high level. On the other hand, the counter 12 retains a value (number of repetition of the second switching operation and the third switching operation) counted from when the output signal Vout from the comparator COMP becomes a low level to when the output signal Vout from the comparator COMP becomes a high level. Then, the counted value is reset. The process illustrated in FIG. 2 described above is repeatedly performed at intervals of a predetermined period of time (for example, at intervals of 4 millisecond). A counted value counted from when the output signal from the comparator COMP becomes a low level to when the output signal from the comparator COMP becomes a high level in each process is retained in the counter 12. While the process illustrated in FIG. 2 is performed, if a human body approaches, a capacitance of the capacitor to be measured C×1 changes. As a result, in comparison with a case where a human body does not approach, larger amount of charge is taken away from the reference capacitor Cs by a single procedure of the second switching operation. Accordingly, when a human body approaches, the number of repetition of the second switching operation (counted value) performed until the Vout changes to a high level tends to reduce. Thus, the counted value described above is associated with a change of capacitance according to an approaching human body. Further, the counted value can be digitally processed.

Figure 3:
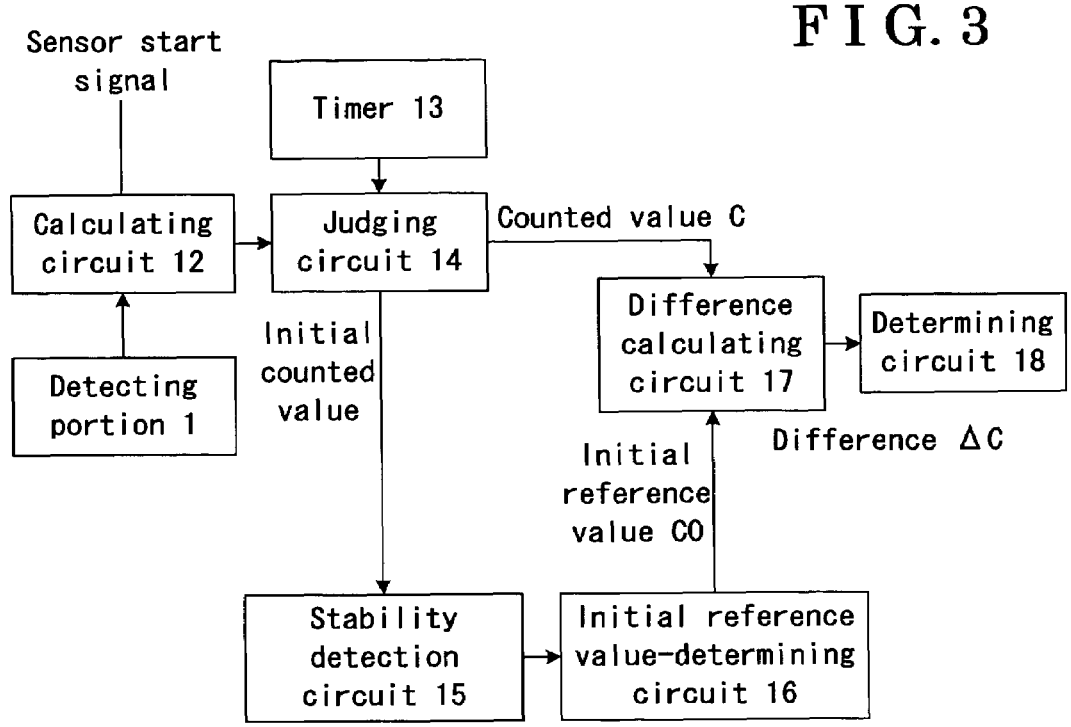
FIG. 3 represents an algorithm illustrating processes until detection of approach of a human body is judged by a control circuit according to the embodiment of the present invention.

FIG. 3 represents a diagram illustrating an algorithm of an operation performed by the control circuit 10 until a judging process for judging whether approach of a human body is detected or not. As described above, the control circuit 10 includes the counter 12. The counter 12 counts and retains (calculates) a counted value C. Incidentally, for example, if counted values are retained at intervals of 4 millisecond as described above, a volume of a register for storing the counted values needs to be large. Such large volume of the resister is uneconomical and disadvantageous in view of space-saving. Accordingly, in this embodiment, counted values are averaged at intervals of 32 millisecond and the averaged values are stored in the resistor. For example, counted values C counted at after 4, 8, 12, 16, 20, 24, 28, 32 millisecond from a start time of the capacitance detection apparatus are averaged, and the averaged value Cav is stored in the register. By doing so, a storage area can be reduced. The reduced storage area can make the capacitance-detection apparatus advantageous in view of costs and space-saving.

The counted value C counted (calculated) by the counter 12 is classified into the initial counted value (initial value) or the normal counted value (normal value) by the judging circuit 14. The judging circuit 14 judges the classification with reference to a time measured by the timer 13. Precisely, if a counted value C is retained in the counter 12 while the timer 13 is counting 250 millisecond, in other words, before 250 millisecond lapses from a start time of the capacitance detection apparatus 100, the counted value C is judged as the initial counted value. On the other hand, if a counted value C is retained in the counter 12 after the timer 13 completes counting 250 millisecond, in other words, after 250 millisecond lapses from a start time of the capacitance detection apparatus 100, the counted value C is judged as the normal counted value. Incidentally, in a case of a capacitance detection apparatus installed in a vehicle for detecting an approaching human body, the detection apparatus does not always in operation. When a user stands away from the vehicle, the detection apparatus is not in operation. The detection apparatus starts operation after identification of the user is checked and recognized by the vehicle through an identification (ID) code. Accordingly, every time the identification of the user is checked and recognized by the vehicle, the capacitance detection apparatus starts operation, and the timer 13 starts counting 250 millisecond.

Then, if the judging circuit 14 judges the counted value C as the initial counted value, the stability detection circuit 15 judges whether the obtained counted value C is stable or not on the basis of a time lapse information from the timer 13 and the counted value C counted by the counter 12. In general, because the detection electrode 1 tends to be unstable immediately after the capacitance detection apparatus starts operation, a first counted value after the capacitance detection apparatus starts operation tends to indicate an abnormal value. Accordingly, the first counted value is generally estimated as an abnormal value. Further, even when the counted value is not the first counted value, if the counted value indicates a value far from a normally obtainable counted value, the detection electrode 1 is estimated yet to be stable and the counted value is judged as an abnormal value.

In a case where the counted value C is judged as a stable value by the stability detection circuit 15, an initial reference value C0 is determined by the initial reference value-determining circuit 16. The initial reference value C0 is utilized as a reference value Cref for calculating a difference between a calculated counted value C judged as the initial counted value by the judging circuit and the reference value Cref. In the embodiment, an average value of counted values calculated at second to nth times after the capacitance detection apparatus 100 starts operation is considered as an initial reference value.

The difference calculating circuit 17 calculates a difference between the calculated counted value C and the reference value Cref. In this case, as a reference value Cref for a counted value C classified to the normal counted value by the judging circuit 14, a past counted value, obtained at a time earlier than a time when the counted value C is counted by 250 millisecond or longer, is utilized. In the embodiment, an average value of successive eight counted values is stored in the register as the counted value Cav. Accordingly, the reference value Cref is also an average value of successive eight counted values. For example, in a case where the calculated counted value is an average value $C_{av260-292}$ of counted values counted at from 260 to 292 millisecond after the capacitance detection apparatus 100 starts operation, a reference value Cref for this is an average value $C_{av8-40}$ of counted values counted at from 8 to 40 millisecond after the capacitance detection apparatus 100 starts operation. Further, in a case where the calculated counted value is an average value $C_{av296-328}$ of counted values counted at from 296 to 328 millisecond after the capacitance detection apparatus 100 starts operation, a reference value Cref for this is an average value $C_{av44-76}$ of counted values counted at from 44 to 76 millisecond after the capacitance detection apparatus 100 starts operation. Then, a difference $\Delta C$ between the counted value C and the reference value Cref is calculated. On the other hand, for a counted value C classified to the initial counted value by the judging circuit 14, because there are no counted value, counted at a time earlier than the counted value C is counted by 250 millisecond or longer, a reference value needs to be determined in a different way from the way described here. In this case, in the embodiment, the initial reference value C0 determined by the initial reference value-determining circuit 16 is utilized as a reference value Cref for counted values classified to the initial counted value. Then, a difference $\Delta C$ between the counted value C and the reference value Cref is calculated.

Next, the determining circuit 18 compares the difference $\Delta C$ between the counted value C and the reference value Cref with a predetermined threshold value $\Delta C$th and determines according to the comparison results whether a human body is approaching. Generally, when a human body approaches, the counted value decreases and the difference $\Delta C$ increases. Accordingly, if the difference $\Delta C$ is lower than the threshold value $\Delta C$th, the determining circuit 18 determines that a human body is not approaching. On the other hand, if the difference $\Delta C$ is larger than the threshold value $\Delta C$th, the determining circuit 18 determines that a human body is approaching. For example, if $\Delta C=30$ and $\Delta C$th=40, the determining circuit 18 determines that a human body is not approaching. If $\Delta C=50$ and $\Delta C$th=40, the determining circuit 18 determines that a human body is approaching.

As described above, in the embodiment, the capacitance detection apparatus 100 includes the initial value-determining circuit 16. Accordingly, even when a counted value C is calculated before a predetermined period of time (250 millisecond in the embodiment) lapses from a start time of the capacitance detection apparatus 100 starts operation, a reference value Cref for the counted value C for calculating a difference $\Delta C$ therebetween can be set as an initial reference value C0. Accordingly, the difference $\Delta C$ between the initial counted value C and the reference value Cref (=C0) can be compared with the threshold value $\Delta C$th. Thus, judgment can be made whether an object (human body, or the like) is approaching or not. Therefore, a response of a capacitance detection apparatus at an initial stage after the capacitance detection apparatus starts operation can be improved.

Figure 4:
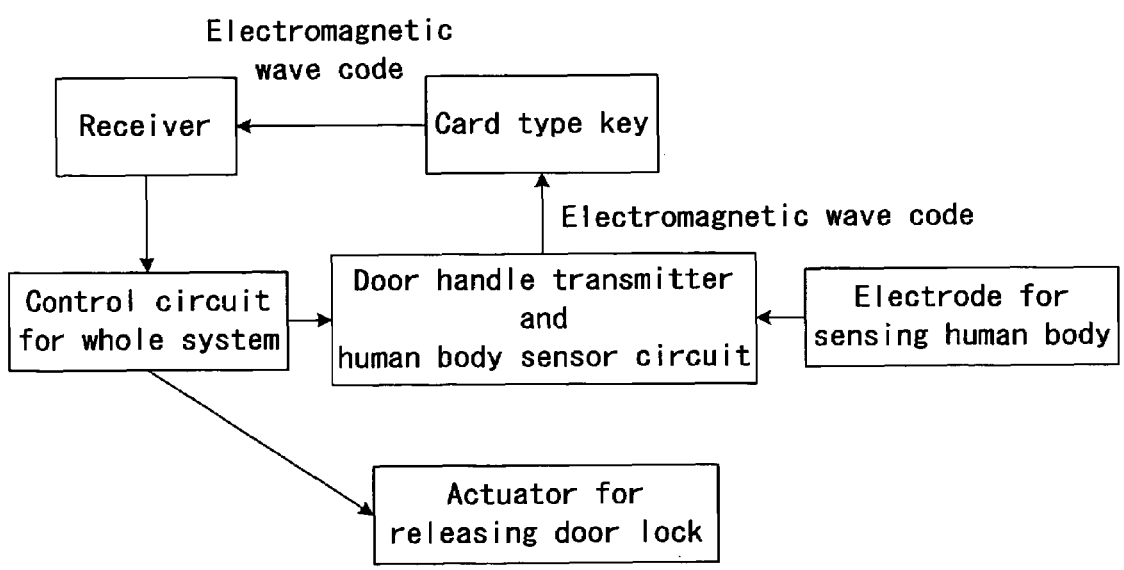
FIG. 4 represents a block diagram illustrating an example in which the capacitance detection apparatus according to the embodiment of the present invention is applied to an unlock system of a vehicle.

An example of the embodiment will be explained. FIG. 4 represents a block diagram illustrating an unlock system of a vehicle to which a capacitance detection apparatus according to the embodiment is applied. In this system, identification of a user is recognized by checking a key through a wireless communication utilizing electromagnetic wave. After the check, when the system detects that the user touches a door handle of the vehicle, the door lock is released. If the embodiment is applied to this system, response for unlocking the vehicle can be improved.

According to an aspect of the present invention, a capacitance detection apparatus for detecting an approaching object on the basis of a change of capacitance includes a detection electrode for detecting the change of the capacitance, a calculating circuit for calculating a value associated with the change of the capacitance detected by the detection electrode, a judging circuit for judging whether the value calculated by the calculating circuit is a normal value which is calculated after a predetermined period of time lapse from a start time of the capacitance detection apparatus or an initial value which is calculated before the predetermined period of time lapse from the start time of the capacitance detection apparatus, an initial reference value-determining circuit for determining an initial reference value for the value judged by the judging circuit as the initial value, a difference calculating circuit for calculating a difference between the value judged by the judging circuit as the normal value and a value calculated at a time earlier than a time when the value judged by the judging circuit as the normal value is calculated by the predetermined period of time or longer, or a difference between the value judged by the judging circuit as the initial value and the initial reference value determined by the initial reference value-determining circuit, and a determining circuit for determining whether or not the object is approaching by comparing the difference calculated by the difference calculating circuit with a predetermined threshold value.

According to the aspect of the present invention, the detection electrode detects a change of the capacitance. The calculating circuit calculates, according to the detected change of the capacitance, the value associated with the change. Further, the judging circuit judges whether the value calculated by the calculating circuit is calculated after a predetermined period of time (normal value, calculated after, for example, 250 millisecond) from when the capacitance detection apparatus starts operation or before the predetermined time lapses (initial value). The initial reference value-determining circuit determines the initial reference value for the value judged as the initial value by the judging circuit. Then, the difference calculating circuit calculates the difference between the calculated value and the predetermined reference value. In this aspect of the present invention, the reference value is calculated utilizing different methods according to whether the calculated value is judged by the judging circuit as the normal value or the initial value. If the calculated value is judged by the judging circuit as the normal value (the value is calculated after a predetermined period of time from when the capacitance detection apparatus starts operation), a value calculated earlier by the predetermined period of time or longer than when the value is calculated is utilized as the reference value. On the other hand, if the calculated value is judged by the judging circuit as the initial value (the value is calculated before the predetermined period of time lapses from when the capacitance detection apparatus starts operation), a value determined by the initial reference value-determining circuit (initial reference value) is utilized as the reference value. Thus, according to the aspect of the present invention, the initial reference value is preset as the reference value in order to calculate a difference between the calculated value judged by the judging circuit as the initial value and the reference value. Further, the difference calculated by the difference calculating circuit is compared with the predetermined threshold value by the determining circuit, and approach of an object is determined on the basis of the comparison result.

In the aspect of the present invention, the capacitance detection apparatus includes the initial reference value-determining circuit. The initial reference-determining circuit determines an initial reference value. The initial reference value is utilized as a reference value associated with a change of the capacitance detected before a predetermined period of time lapses. Then, a difference between the value associated with the change of capacitance and the reference value can be calculated. Accordingly, the difference corresponding to the change of capacitance before the predetermined period of time lapses can be compared with the predetermined threshold value, and approach of an object can be judged. Therefore, approach of an object can be judged even before the predetermined period of time lapses. Thus, response of a capacitance detection apparatus at an initial stage of starting the capacitance detection apparatus can be improved.

Incidentally, in the description described above, "a value associated with a change of capacitance" can employ any kind of value if the value indicates a change of capacitance. In this case, the value can be processed by a digital process (for example, utilizing voltage corresponding to capacitance) in view of miniaturizing a detection apparatus.

Further, a particular length of a predetermined period of time, utilized by the judging circuit for judging whether the value is calculated after or before the predetermined period of time lapses, cannot be determined because an appropriate length of the period of time varies according to a kind of an object to be detected. However, for some kinds of an object to be detected, a specific appropriate length of the period of time for the object to be detected can be determined on the basis of past records of the capacitance change caused by the same kind of the object. Accordingly, if a kind of object to be detected is determined in advance, a length of the period of time utilized by the judging circuit can be predetermined to some extent. Incidentally, as described above, if a human body is intended to be detected, the period of time can be predetermined to approximately 250 millisecond.

Further, it is also possible to predetermine the initial reference value. However, if the initial reference value is determined on the basis of a value calculated before a value (actual value), which is utilized for calculating a difference from the initial reference value, is calculated, possibility of detection errors can be reduced. In particular, if an average of values calculated at second and third time after the capacitance detection apparatus starts operation is utilized as the initial reference value, because a time interval from when the values are calculated at second and third time to when the actual value is calculated can be long, possibility of detection errors can be lowered. Incidentally, in this case, if a length of calculation intervals (calculation frequency) before the predetermined period of time lapses from the start time is made shorter (in other words, increase calculation frequency) than that after the predetermined period of time lapses, or, if a length of calculation intervals during a period of time for determining the initial reference value is made shorter (in other words, increase calculation frequency) than that during other period of time, accuracy of the initial reference value can be improved. For example, by setting a length of calculation intervals (scan intervals) before the predetermined period of time lapses from the start time (for example, 250 millisecond) or during a period of time for determining the initial reference value to 2 millisecond, and setting a length of calculation intervals after the predetermined time lapses or a period of time other than that for determining the initial reference value to 4 millisecond, accuracy of the initial reference value can be improved. Further, a value calculated at a first time after the capacitance detection apparatus starts operation generally shows an abnormal value because the detection electrode is still unstable, the value calculated at the first time can be left out of consideration for determining the initial reference value.

In addition, a threshold value utilized as a reference value for judging by the judging circuit can be constant or variable. If the threshold value is variable, the threshold value can be varied proportionally to an absolute value of the calculated value.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

The invention claimed is:

1. A capacitance detection apparatus for detecting an approach of an object on the basis of a change of capacitance, comprising:
   a detection electrode for detecting the change of the capacitance by approaching the object;
   a calculating circuit for calculating a value associated with the change of the capacitance detected by the detection electrode;
   a judging circuit for judging whether the value calculated by the calculating circuit is a normal value which is calculated after a predetermined period of time lapse from a start time of the capacitance detection apparatus or an initial value which is calculated before the predetermined period of time lapse from the start time of the capacitance detection apparatus;
   an initial reference value-determining circuit for determining an initial reference value for the value judged by the judging circuit as the initial value;
   a difference calculating circuit for calculating a difference between the value judged by the judging circuit as the normal value and a value calculated at a time earlier than a time when the value judged by the judging circuit as the normal value is calculated by the predetermined period of time or longer, or a difference between the value judged by the judging circuit as the initial value and the initial reference value determined by the initial reference value-determining circuit; and
   a determining circuit for determining whether or not the object is approaching by comparing the difference calculated by the difference calculating circuit with a predetermined threshold value.

2. The capacitance detection apparatus according to claim 1, wherein the detection electrode is provided in a detecting portion and the detecting portion includes a first open/close switch provided between both ends of a reference capacitor one end of which is further connected to a first voltage source, a second open/close switch provided between the other end of the reference capacitor and one end of a capacitor to be measured for the detection electrode, the other end of the capacitor to be measured being connected to a second voltage source, and a third open/close switch provided between the one end of the capacitor to be measured and the second voltage source.

3. The capacitance detection apparatus according to claim 2, wherein the detection portion further includes a comparator connected to the other end of the reference capacitor for comparing a voltage at the other end of the reference capacitor with a reference voltage.

4. The capacitance detection apparatus according to claim 2, wherein a potential of the second voltage source in the detecting portion is a ground potential.

5. The capacitance detection apparatus according to claim 2, further comprising a switch control means for performing a first switching operation in which an opening/closing operation of the first open/close switch is performed and for performing a second switching operation in which an opening/closing operation of the second open/close switch is performed after the first switching operation.

6. The capacitance detection apparatus according to claim 2, further comprising a switch control means for performing a first switching operation in which an opening/closing operation of the first open/close switch is performed, a second switching operation in which an opening/closing operation of the second open/close switch is performed and a third switching operation in which an opening/closing operation of the third open/close switch is performed, the first, second and third switching operations being repeated in a predetermined sequence.

7. The capacitance detection apparatus according to claim 5, wherein the switch control means performs a third switching operation in which an opening/closing operation of the third open/close switch is performed after the second switching operation and thereafter alternately repeats the second switching operation and the third switching operation.

8. The capacitance detection apparatus according to claim 7, wherein the calculating circuit is a counter for counting a number of repetition of the second switching operation, and a control circuit includes a timer for measuring the predetermined period of time lapse from the start time of the capacitance detection apparatus and the judging circuit for judging whether a value counted by the counter and retained in the counter is an initial counted value or a normal counted value.

9. The capacitance detection apparatus according to claim 8, wherein a comparator is connected to the other end of the reference capacitor for comparing a voltage at the other end of the reference capacitor with a reference voltage, and the counter retains, for a predetermined period of time, the repetition number of the second switching operation and the third switching operation until an output of the comparator changes.

10. The capacitance detection apparatus according to claim 8, wherein the capacitance detection apparatus is provided in a vehicle, the capacitance detection apparatus starts operation when an identification is checked and recognized between the vehicle and the outside of the vehicle, the timer starts counting at the start time of the capacitance detection apparatus, and the counted value is judged by the judging circuit and classified into the initial counted value or the normal counted value.

11. The capacitance detection apparatus according to claim 8, wherein the control circuit includes a stability detection circuit for judging whether the counted value judged by the judging circuit as the initial counted value is stable or not, and when the stability detection circuit judges that the counted value is stable, the initial reference value-determining circuit determines the initial reference value.

* * * * *